United States Patent
Dory et al.

(10) Patent No.: US 10,490,417 B2
(45) Date of Patent: Nov. 26, 2019

(54) ETCHING COMPOSITION

(71) Applicant: Fujifilm Electronic Materials U.S.A., Inc., North Kingstown, RI (US)

(72) Inventors: Thomas Dory, Gilbert, AZ (US); Emil A. Kneer, Mesa, AZ (US); Tomonori Takahashi, Mesa, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

(21) Appl. No.: 14/659,663

(22) Filed: Mar. 17, 2015

(65) Prior Publication Data

US 2015/0267112 A1    Sep. 24, 2015

Related U.S. Application Data

(60) Provisional application No. 61/954,698, filed on Mar. 18, 2014.

(51) Int. Cl.
| | | |
|---|---|---|
| *H01L 21/3213* | (2006.01) | |
| *C23F 1/00* | (2006.01) | |
| *C23F 1/32* | (2006.01) | |
| *H01L 21/02* | (2006.01) | |
| *C09K 13/06* | (2006.01) | |

(52) U.S. Cl.
CPC ........ *H01L 21/32134* (2013.01); *C09K 13/06* (2013.01); *C23F 1/00* (2013.01); *C23F 1/32* (2013.01); *H01L 21/02057* (2013.01)

(58) Field of Classification Search
CPC ........ H01L 21/32134; H01L 21/02057; C09K 13/06; C23F 1/00; C23F 1/32
USPC .................. 252/79.1, 79.4; 216/96, 106, 108
See application file for complete search history.

(56) References Cited

U.S. PATENT DOCUMENTS

| | | | | |
|---|---|---|---|---|
| 6,099,604 A * | 8/2000 | Sandhu | ..................... | C09G 1/02 106/3 |
| 7,300,480 B2 | 11/2007 | Bian et al. | | |
| 2005/0066585 A1* | 3/2005 | Bian | ........................ | C09G 1/02 51/307 |
| 2006/0207635 A1* | 9/2006 | Bian | .................... | H01L 21/3212 134/42 |
| 2007/0078073 A1 | 4/2007 | Auger | | |
| 2007/0131899 A1 | 6/2007 | Bian | | |
| 2007/0298611 A1 | 12/2007 | Bian | | |
| 2008/0026583 A1* | 1/2008 | Hardy | ................... | B24B 37/044 438/693 |
| 2009/0017636 A1 | 1/2009 | Kumazawa et al. | | |
| 2009/0215658 A1 | 8/2009 | Minsek et al. | | |
| 2009/0301996 A1* | 12/2009 | Visintin | ............... | C11D 3/0073 216/13 |
| 2011/0318928 A1* | 12/2011 | Bian | ........................ | C09G 1/02 438/693 |
| 2012/0048295 A1 | 3/2012 | Du et al. | | |
| 2013/0200039 A1* | 8/2013 | Noller | ...................... | C09G 1/02 216/13 |
| 2013/0203643 A1* | 8/2013 | Nakanishi | ............ | C11D 3/0042 510/175 |
| 2014/0038420 A1 | 2/2014 | Chen et al. | | |
| 2014/0111019 A1 | 4/2014 | Roy et al. | | |
| 2015/0111804 A1 | 4/2015 | Dory et al. | | |

FOREIGN PATENT DOCUMENTS

| | | | | |
|---|---|---|---|---|
| EP | 1 755 003 | 2/2007 | ............. | G06F 7/42 |
| EP | 1 772 495 | 4/2007 | ............... | C09D 9/00 |
| JP | 2005-167199 | 6/2005 | .......... | H01L 12/304 |
| JP | 2007-100086 | 4/2007 | ............... | C11D 7/60 |
| JP | 2007-180534 | 7/2007 | .......... | H01L 12/304 |
| JP | 2008-016841 | 1/2008 | .......... | H01L 21/304 |
| JP | 2009-512194 | 3/2009 | .......... | H01L 12/304 |
| WO | WO 2007/044446 | 4/2007 | .......... | H01L 21/461 |
| WO | WO 2013/101907 | 7/2013 | .......... | H01L 21/311 |

OTHER PUBLICATIONS

Chemcialland21.com; "Tolytriazole" via http://www.chemicalland21.com/specialtychem/perchem/TOLYLTRIAZOLE.htm ; 2 pages; No date available.*
International Search Report and Written Opinion for International Application No. PCT/US15/20863 dated Jun. 19, 2015 (18 pages).
Supplementary European Search Report for European Application No. EP 15 76 5751 dated Oct. 20, 2017.
Communication from the European Patent Office for European Application No. 15 726 771.7 dated Dec. 7, 2017.
Japanese Office Action for Japanese Application No. JP 2017-501072 dated Feb. 13, 2019.
Singapore Search Report and Written Opinion for Singapore Application No. 11201607700Q dated Mar. 7, 2019.
Taiwan Office Action for Taiwan Application No. 104108477 dated Sep. 14, 2018 (with English Translation).
Search Report for Taiwan Patent Application No. 104108477 dated Sep. 10, 2018 (with English Translation).

* cited by examiner

*Primary Examiner* — Binh X Tran
(74) *Attorney, Agent, or Firm* — Fish & Richardson P.C.

(57) ABSTRACT

This disclosure relates to etching compositions containing 1) at least one oxidizing agent; 2) at least one chelating agent; 3) at least one metal corrosion inhibitor; 4) at least one organic solvent; 5) at least one amidine base; and 6) water.

16 Claims, No Drawings

ETCHING COMPOSITION

CROSS-REFERENCE TO RELATED APPLICATION

The present application claims priority to U.S. Provisional Application Ser. No. 61/954,698, filed on Mar. 18, 2014, the contents of which are hereby incorporated by reference in its entirety.

TECHNICAL FIELD

The present disclosure relates to compositions and processes to selectively etch titanium nitride in the presence of other materials, such as metal conductors, barrier materials, insulator materials, and exposed or underlying layers of copper, tungsten, and low-k dielectric materials.

BACKGROUND

The semiconductor industry is rapidly decreasing the dimensions and increasing the density of electronic circuitry and electronic components in microelectronic devices, silicon chips, liquid crystal displays, MEMS (Micro Electro Mechanical Systems), printed wiring boards, and the like. The integrated circuits within them are being layered or stacked with constantly decreasing thicknesses of the insulating layer between each circuitry layer and smaller and smaller feature sizes. As the feature sizes have shrunk, patterns have become smaller, and device performance parameters tighter and more robust. As a result, various issues which heretofore could be tolerated, can no longer be tolerated or have become more of an issue due to the smaller feature size.

In the production of advanced integrated circuits, to minimize problems associated with the higher density and to optimize performance, both high k and low k insulators, and assorted barrier layer materials have been employed.

Titanium nitride (TiN) is utilized for semiconductor devices, liquid crystal displays, MEMS (Micro Electro Mechanical Systems), printed wiring boards and the like, and as ground layers and cap layers for precious metal, aluminum (Al) and copper (Cu) wiring. In semiconductor devices, it may be used as a barrier metal, a hard mask, or a gate metal.

In the construction of devices for these applications, TiN frequently needs to be etched. In the various types of uses and device environments of TiN, other layers are in contact with or otherwise exposed at the same time as the TiN is etched. Highly selective etching of the TiN in the presence of these other materials (e.g. metal conductors, dielectric, and hard marks) is mandatory for device yield and long life. The etching process for the TiN may be a plasma etching process. However, using a plasma etching process on the TiN layer may cause damage to either or both the gate insulating layer and the semiconductor substrate. In addition, the etching process may remove a portion of the semiconductor substrate by etching the gate insulating layer exposed by the gate electrode. The electrical characteristics of the transistor may be negatively impacted. To avoid such etching damage, additional protective device manufacturing steps may be employed, but at significant cost.

Wet etching methods for TiN are known. Such methods may include use of etchants containing hydrofluoric acid in combination with other reagents. However, the selectivity with silicon based dielectrics and metals (e.g., Al) is not sufficient and other exposed metals in the device may also undergo corrosion or etching.

Hydrogen peroxide/ammonia/EDTA (ethylenediaminetetraacetic acid) mixtures and hydrogen peroxide/phosphate mixtures have been disclosed as means of overcoming the acidic HF based etchants. However, the etch rates obtained are insufficient.

Thus, there is a need for TiN etching solutions that have high etch rates, but have low etch and corrosion rates for other semiconductor materials which are exposed or in contact with the TiN during the etching process.

SUMMARY

The present disclosure relates to compositions and processes for selectively etching TiN relative to metal conductor layers, hard mask layers and low-k dielectric layers that are present in the semiconductor device. More specifically, the present disclosure relates to a composition and process for selectively etching titanium nitride relative to copper, tungsten, and low-k dielectric layers.

In one aspect, the disclosure features an etching composition (e.g., an etching composition for selectively removing titanium nitride) that includes:
1) at least one oxidizing agent;
2) at least one chelating agent;
3) at least one metal corrosion inhibitor;
4) at least one organic solvent;
5) at least one amidine base; and
6) water.

In another aspect, the disclosure features a method that includes contacting a semiconductor substrate containing TiN features with an etching composition disclosed herein to remove the TiN features.

In still another aspect, the disclosure features an article formed by the method described above, in which the article is a semiconductor device (e.g., an integrated circuit).

In some embodiments, the etching compositions for selectively removing titanium nitride contain:
1) about 0.1% to about 30% by weight of at least one oxidizing agent;
2) about 0.01% to about 1% by weight of at least one chelating agent;
3) about 0.05% to about 1% by weight of at least one metal corrosion inhibitor;
4) about 1% to about 30% by weight of at least one organic solvent;
5) about 0.1 to about 5% by weight of at least one amidine base (e.g., to adjust the pH to between about 6.5 and about 9.5); and
6) about 35% to about 98% water.

In some embodiments, the etching compositions for selectively removing titanium nitride contain:
1) about 0.1% to about 30% by weight of hydrogen peroxide;
2) about 0.01% to about 1% by weight of at least one polyaminopolycarboxylic acid chelating agent;
3) about 0.05% to about 1% by weight of at least one metal corrosion inhibitor selected from the group consisting of substituted and unsubstituted benzotriazoles;
4) about 1% to about 30% by weight of at least one organic solvent selected from the group consisting of water soluble alcohols, water soluble ketones, water soluble esters, and water soluble ethers;
5) about 0.1 to about 5% by weight of at least one amidine base (e.g., to adjust the pH to between about 6.5 and about 9.5); and
6) about 35% to about 98% water.

DETAILED DESCRIPTION OF THE DISCLOSURE

As defined herein, unless otherwise noted, all percentages expressed should be understood to be percentages by weight to the total weight of the etching composition. Unless otherwise noted, ambient temperature is defined to be between about 16 and about 27 degrees Celsius (° C.).

As defined herein, a "water-soluble" substance (e.g., a water-soluble alcohol, ketone, ester, or ether) refers to a substance having a solubility of at least 5% by weight in water at 25° C.

In one aspect, the disclosure features an etching composition (e.g., an etching composition for selectively removing titanium nitride) that includes:

1) at least one oxidizing agent;
2) at least one chelating agent;
3) at least one metal corrosion inhibitor;
4) at least one organic solvent;
5) at least one amidine base; and
6) water.

The etching compositions of this disclosure can contain any oxidizing agent suitable for use in microelectronic cleaning compositions. Examples of the oxidizing agent to be used in the compositions of this disclosure include, but are not limited to, peroxides (e.g., hydrogen peroxide, dialkylperoxides, urea hydrogen peroxide), persulfonic acid (e.g., hexafluoropropanepersulfonic acid, methanepersulfonic acid, trifluoromethanepersulfonic acid, or p-toluenepersulfonic acid) and salts thereof, ozone, percarbonic acids (e.g., peracetic acid) and salts thereof, perphosphoric acid and salts thereof, persulfuric acid and salts thereof (e.g., ammonium persulfate or tetramethylammonium persulfate), perchloric acid and salts thereof (e.g., ammonium perchlorate or tetramethylammonium perchlorate), and periodic acid and salts thereof (e.g., ammonium periodate or tetramethylammonium periodate). These oxidizing agents can be used singly or in combination.

In some embodiments, the etching compositions of this disclosure include at least about 0.1% by weight (e.g., at least about 1% by weight, at least about 5% by weight, or at least about 10% by weight) and/or at most about 30% by weight (e.g., at most about 25% by weight, at most about 20% by weight, or at most about 15% by weight) of the oxidizing agent.

The etching compositions of this disclosure contain at least one chelating agent, which can be, but is not limited to, a polyaminopolycarboxylic acid. For the purposes of this disclosure, a polyaminopolycarboxylic acid refers to a compound with a plurality of amino groups and a plurality of carboxylic acid groups. Suitable classes of polyaminopolycarboxylic acid chelating agents include, but are not limited to mono- or polyalkylene polyamine polycarboxylic acids, polyaminoalkane polycarboxyalic acids, polyaminoalkanol polycarboxylic acids, and hydroxyalkylether polyamine polycarboxylic acids.

Suitable polyaminopolycarboxylic acid chelating agents include, but are not limited to, butylenediaminetetraacetic acid, diethylenetriaminepentaacetic acid (DTPA), ethylenediaminetetrapropionic acid, triethylenetetraminehexaacetic acid, 1,3-diamino-2-hydroxypropane-N,N,N',N'-tetraacetic acid, propylenediaminetetraacetic acid, ethylenediaminetetraacetic acid (EDTA), trans-1,2-diaminocyclohexane tetraacetic acid, ethylendiamine diacetic acid, ethylendiamine dipropionic acid, 1,6-hexamethylene-diamine-N,N,N',N'-tetraacetic acid, N,N-bis(2-hydroxybenzyl)ethylenediamine-N,N-diacetic acid, diaminopropane tetraacetic acid, 1,4,7,10-tetraazacyclododecane-tetraacetic acid, diaminopropanol tetraacetic acid, and (hydroxyethyl)ethylenediaminetriacetic acid.

In some embodiments, the etching compositions of this disclosure include at least about 0.01% by weight (e.g., at least about 0.1% by weight, at least about 0.2% by weight, or at least about 0.3% by weight) and/or at most about 1% by weight (e.g., at most about 0.7% by weight, at most about 0.6% by weight, or at most about 0.5% by weight) of the polyaminopolycarboxylic acid chelating agent.

The etching compositions of this disclosure contain at least one metal corrosion inhibitor selected from substituted or unsubstituted benzotriazoles. Suitable classes of substituted benzotriazole include, but are not limited to, benzotriazoles substituted with alkyl groups, aryl groups, halogen groups, amino groups, nitro groups, alkoxy groups, and hydroxyl groups. Substituted benzotriazoles also include those fused with one or more aryl (e.g., phenyl) or heteroaryl groups.

Suitable benzotriazoles for use as a metal corrosion inhibitor include, but are not limited to, benzotriazole (BTA), 5-aminobenzotriazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 2-(5-amino-pentyl)-benzotriazole, 1-amino-benzotriazole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butyl benzotriazole, 5-(1',1'dimethylpropyl)benzotriazole, 5-(1',1',3'-trimethylbutyl) benzotriazole, 5-n-octyl benzotriazole, and 5-(1',1',3',3'-tetramethylbutyl)benzotriazole.

In some embodiments, the etching compositions of this disclosure include at least about 0.05% by weight (e.g., at least about 0.1% by weight, at least about 0.2% by weight, or at least about 0.3% by weight) and/or at most about 1% by weight (e.g., at most about 0.7% by weight, at most about 0.6% by weight, or at most about 0.5% by weight) of the metal corrosion inhibitor.

The etching compositions of this disclosure contain at least one organic solvent. Preferably the organic solvent is selected from the group consisting of water soluble alcohols, water soluble ketones, water soluble esters, and water soluble ethers (e.g., glycol diethers).

Classes of water soluble alcohols include, but are not limited to, alkane diols (including, but not limited to, alkylene glycols), glycols, alkoxyalcohols (including but not limited to glycol monoethers), saturated aliphatic monohydric alcohols, unsaturated non-aromatic monohydric alcohols, and low molecular weight alcohols containing a ring structure.

Examples of water soluble alkane diols includes, but are not limited to, 2-methyl-1,3-propanediol, 1,3-propanediol, 2,2-dimethyl-1,3-diol, 1,4-butanediol, 1,3-butanediol, 1,2-butanediol, 2,3-butanediol, pinacol, and alkylene glycols.

Examples of water soluble alkylene glycols include, but are not limited to, ethylene glycol, propylene glycol, diethylene glycol, dipropylene glycol, triethylene glycol and tetraethyleneglycol.

Examples of water soluble alkoxyalcohols include, but are not limited to, 3-methoxy-3-methyl-1-butanol, 3-methoxy-1-butanol, 1-methoxy-2-butanol, and water soluble glycol monoethers.

Examples of water soluble glycol monoethers include, but are not limited to, ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutylether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol monobutyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

Examples of water soluble saturated aliphatic monohydric alcohols include, but are not limited to methanol, ethanol, n-propyl alcohol, isopropyl alcohol, 1-butanol, 2-butanol, isobutyl alcohol, tert-butyl alcohol, 2-pentanol, t-pentyl alcohol, and 1-hexanol.

Examples of water soluble unsaturated non-aromatic monohydric alcohols include, but are not limited to, allyl alcohol, propargyl alcohol, 2-butenyl alcohol, 3-butenyl alcohol, and 4-penten-2-ol.

Examples of water soluble, low molecular weight alcohols containing a ring structure include, but are not limited, to tetrahydrofurfuryl alcohol, furfuryl alcohol, and 1,3-cyclopentanediol.

Examples of water soluble ketones include, but are not limited to, acetone, cyclobutanone, cyclopentanone, diacetone alcohol, 2-butanone, 5-hexanedione, 1,4-cyclohexanedione, 3-hydroxyacetophenone, 1,3-cyclohexanedione, and cyclohexanone.

Examples of water soluble esters include, but are not limited to, ethyl acetate, glycol monoesters (such as ethylene glycol monoacetate and diethyleneglycol monoacetate), and glycol monoether monoesters (such as propylene glycol monomethyl ether acetate, ethylene glycol monomethyl ether acetate, propylene glycol monoethyl ether acetate, and ethylene glycol monoethylether acetate).

In some embodiments, the etching compositions of this disclosure include at least about 1% by weight (e.g., at least about 5% by weight, at least about 8% by weight, or at least about 10% by weight) and/or at most about 30% by weight (e.g., at most about 25% by weight, at most about 20% by weight, or at most about 15% by weight) of the organic solvent.

The etching compositions of this disclosure contain at least one amidine base. The term amidine base in this disclosure is used to describe a compound having as a substructural group "$N^1$—C=$N^2$" with the proviso neither nitrogen is embedded in an aromatic or pseudoaromatic ring (e.g., imidazole, pyridine, thiazole, oxazole, or pyrimidine rings) and furthermore is not considered an amine. Examples of suitable amidine bases include, but are not limited to substituted or unsubstituted formamidines, substituted or unsubstituted acetamidines (such as methyl acetamidine and ethyl acetamidine), substituted or unsubstituted benzamidines, diminazen, and compounds containing an amidine group in a fused non-aromatic ring (such as 1,8-diazabicyclo[5.4.0]undec-7-ene (DBU) and 1,5-diazabicyclo[4.3.0]non-5-ene (DBN)).

In some embodiments, the etching compositions of this disclosure include at least about 0.1% by weight (e.g., at least about 0.3% by weight, at least about 0.5% by weight, or at least about 0.7% by weight) and/or at most about 5% by weight (e.g., at most about 3% by weight, at most about 2% by weight, or at most about 1% by weight) of the amidine base.

The etching compositions of the present disclosure further include water. Preferably, the water is de-ionized and ultrapure, contains no organic contaminants and has a minimum resistivity of about 4 to about 17 mega Ohms. More preferably, the resistivity of the water is at least about 17 mega Ohms.

In some embodiments, the etching compositions of this disclosure include at least about 35% by weight (e.g., at least about 45% by weight, at least about 50% by weight, or at least about 55% by weight) and/or at most about 98% by weight (e.g., at most about 95% by weight, at most about 85% by weight, or at most about 70% by weight) of water.

In some embodiments, the compositions of this disclosure can have a pH of at least about 6.5 (e.g., at least about 7, at least about 7.5, or at least about 8) and/or at most about 9.5 (e.g., at most about 9, at most about 8.5, or at most about 8). Without wishing to be bound by theory, it is believed that a cleaning composition having a pH lower than 6.5 would significantly increase cobalt etch rate and reduce TiN etch rate, and a cleaning composition having a pH higher than 9.5 would result in increased decomposition of the oxidizing agent (e.g., hydrogen peroxide) and significantly increased corrosion to tungsten. In order to obtain the desired pH, the relative concentrations of the polyaminopolycarboxylic acid, the benzotriazole (or its derivative), and the amidine base may be adjusted.

In addition, in some embodiments, the etching compositions of the present disclosure may contain additives such as, additional pH adjusting agents, additional corrosion inhibitors, surfactants, additional organic solvents, biocides, and defoaming agents as optional components.

Examples of suitable defoaming agents include polysiloxane defoamers (e.g., polydimethylsiloxane), polyethylene glycol methyl ether polymers, ethylene oxide/propylene oxide copolymers, and glycidyl ether capped acetylenic diol ethoxylates (such as those described in U.S. Pat. No. 6,717,019, herein incorporated by reference). Optional surfactants may be cationic, anionic, nonionic or amphoteric.

In some embodiments, the etching compositions of the present disclosure may specifically exclude one or more of the additive components, in any combination, if more than one. Such components are selected from the group consisting of oxygen scavengers, quaternary ammonium salts, including quaternary ammonium hydroxides, amines, alkaline bases (such as NaOH, KOH, and LiOH), surfactants other than a defoamer, a defoamer, fluoride containing compounds, abrasives, hydroxycarboxylic acids, carboxylic and polycarboxylic acids lacking amino groups, buffering agents, and non-azole corrosion inhibitors.

The etching compositions of this disclosure may be prepared by simply mixing the components together, or may be prepared by blending two compositions in a kit. The first composition in the kit can be an aqueous solution of an oxidizing agent (e.g., hydrogen peroxide). The second composition in the kit can contain remaining components of the etching compositions of this disclosure at predetermined ratios in a concentrated form such that the blending of the two compositions will yield a desired composition of the disclosure.

In some embodiments, the second composition of the kit contains:

1) about 0.1% to about 8% by weight of at least one chelating agent (e.g., at least one polyaminopolycarboxylic acid chelating agent);

2) about 0.4% to about 8% by weight of at least one metal corrosion inhibitor (e.g., at least one substituted or unsubstituted benzotriazole);

3) about 40% to about 90% by weight of at least one organic solvent (e.g., at least one organic solvent selected from the group consisting of water soluble alcohols, water soluble ketones, water soluble esters, and water soluble ethers);

4) about 1.0% to about 7% by weight of an amidine base; and 5) about 5% to about 15% water.

In some embodiments, the second composition of the kit contains:

1) about 0.1% to about 8% by weight of at least one chelating agent (e.g., at least one polyaminopolycarboxylic acid chelating agent);

2) about 0.4% to about 8% by weight of at least one metal corrosion inhibitor (e.g., at least one substituted or unsubstituted benzotriazole);

3) about 5% to about 90% by weight of at least one organic solvent (e.g., at least one organic solvent selected from the group consisting of water soluble alcohols, water soluble ketones, water soluble esters, and water soluble ethers);

4) about 1.0% to about 7% by weight of an amidine base; and 5) about 5% to about 50% water.

Alternatively, the etching compositions of this disclosure may be prepared by blending three compositions in a kit. In such embodiments, the first composition can include the oxidizing agent in the form of an aqueous concentrate, the second composition can include water only, and the third composition can include all of the remaining components of the etching compositions of this disclosure at predetermined ratios.

For example, a 100 g sample of a composition of this disclosure could be made by blending 87.75 g of a first composition containing 20% hydrogen peroxide with 12.25 g of a second composition containing 81% EGBE, 2% 5-methylbenzotriazole, 2.0% diethylenetriaminepentaacetic acid, 5% DBU, and 10% water. Alternatively, the same composition could be prepared by blending of 56.27 g of 31.1% hydrogen peroxide, 31.48 g of water and 12.25 g of a composition of 81% EGBE, 2% 5-methylbenzotriazole, 2.0% diethylenetriaminepentaacetic acid, 5% DBU, and 10% water.

One embodiment of the present disclosure is a method of etching a semiconductor substrate containing TiN features that includes contacting a semiconductor substrate containing TiN features with an etching composition of this disclosure to remove the TiN features. The method can further include rinsing the semiconductor substrate with a rinse solvent after the contacting step and/or drying the semiconductor substrate after the rinsing step. In some embodiments, the method does not substantially remove Co, SiN, or Cu in the semiconductor substrate. For example, the method does not remove more than about 5% by weight (e.g., more than about 3% by weight or more than about 1% by weight) of Co, SiN, or Cu in the semiconductor substrate.

In some embodiments, the etching method includes the steps of:

(A) providing a semiconductor substrate containing TiN features;

(B) contacting the semiconductor substrate with an etching composition described herein;

(C) rinsing the semiconductor substrate with one or more suitable rinse solvents; and (D) optionally, drying the semiconductor substrate (e.g., by any suitable means that removes the rinse solvent and does not compromise the integrity of said semiconductor substrate).

In some embodiments, the etching method further includes forming a semiconductor device (e.g., an integrated circuit device such as a semiconductor chip) from the semiconductor substrate obtained by the method described above.

The semiconductor substrates containing TiN features to be etched in this method can contain organic and organometallic residues, and additionally, a range of metal oxides that may also be removed during the etching process.

Semiconductor substrates typically are constructed of silicon, silicon germanium, Group III-V compounds like GaAs, or any combination thereof. The semiconductor substrates may additionally contain exposed integrated circuit structures such as interconnect features like metal lines and dielectric materials. Metals and metal alloys used for interconnect features include, but are not limited to, aluminum, aluminum alloyed with copper, copper, titanium, tantalum, cobalt, silicon, titanium nitride, tantalum nitride, and tungsten. The semiconductor substrate may also contain layers of interlayer dielectrics, silicon oxide, silicon nitride, silicon carbide, titanium oxide, and carbon doped silicon oxides.

The semiconductor substrate can be contacted with the etching composition by any suitable method, such as placing the etching composition into a tank and immersing and/or submerging the semiconductor substrate into the etching composition, spraying the etching composition onto the semiconductor substrate, streaming the etching composition onto the semiconductor substrate, or any combinations thereof. In some embodiments, the semiconductor substrate is immersed into the etching composition.

The etching compositions of the present disclosure may be effectively used up to a temperature of about 85° C. In some embodiments, the etching compositions can be used from about 20° C. to about 80° C. In some embodiments, the etching compositions can be employed in the temperature range from about 55° C. to about 65° C. In some embodiments, a temperature range of about 60° C. to about 65° C. is employed. The etch rate of TiN increases with temperature in this range, thus processes with higher temperature can be run for shorter times and lower temperatures require longer etching times.

Etching times can vary over a wide range depending on the particular etching method, thickness and temperature employed. When etching in an immersion batch type process, a suitable time range is, for example, up to about 10 minutes. In some embodiments, a range for a batch type process is from about 1 minute to about 7 minutes. In some embodiments, a time range for a batch type process is from about 1 minute to about 5 minutes. In some embodiments, a time range for a batch type etching process is from about 2 minutes to about 4 minutes.

Etching times for a single wafer process may range from about 30 seconds to about 5 minutes. In some embodiments, an etching time for a single wafer process may range from about 30 seconds to about 4 minutes. In some embodiments, an etching time for a single wafer process may range from about 1 minute to about 3 minutes. In some embodiments, an etching time for a single wafer process may range from about 1 minute to about 2 minutes.

To further promote the etching ability of the etching composition of the present disclosure, mechanical agitation means may be employed. Examples of suitable agitation means include circulation of the etching composition over the substrate, streaming or spraying the etching composition over the substrate, and ultrasonic or megasonic agitation during the etching process. The orientation of the semiconductor substrate relative to the ground may be at any angle. Horizontal or vertical orientations are preferred.

Subsequent to the etching, the semiconductor substrate is rinsed with a suitable rinse solvent for about 5 seconds up to about 5 minutes with or without agitation means. Multiple rinse steps employing different rinse solvents may be employed. Examples of suitable rinse solvents include, but are not limited to, deionized (DI) water, methanol, ethanol, isopropyl alcohol, N-methylpyrrolidinone, gamma-butyrolactone, dimethyl sulfoxide, ethyl lactate and propylene glycol monomethyl ether acetate. Alternatively, or in addition, aqueous rinses with pH>8 (such as dilute aqueous ammonium hydroxide) may be employed. Examples of rinse solvents include, but are not limited to, dilute aqueous ammonium hydroxide, DI water, methanol, ethanol and isopropyl alcohol. In some embodiments, the rinse solvents are dilute aqueous ammonium hydroxide, DI water and isopropyl alcohol. In some embodiments, the rinse solvents are dilute aqueous ammonium hydroxide and DI water. The solvent may be applied using means similar to that used in applying an etching composition described herein. The etching composition may have been removed from the semiconductor substrate prior to the start of the rinsing step or it may still be in contact with the semiconductor substrate at the start of the rinsing step. In some embodiments, the temperature employed in the rinsing step is between 16° C. and 27° C.

Optionally, the semiconductor substrate is dried after the rinsing step. Any suitable drying means known in the art may be employed. Examples of suitable drying means include spin drying, flowing a dry gas across the semiconductor substrate, or heating the semiconductor substrate with a heating means such as a hotplate or infrared lamp, Maragoni drying, rotagoni drying, IPA drying or any combinations thereof. Drying times will be dependent on the specific method employed but are typically on the order of 30 seconds up to several minutes.

EXAMPLES

The present disclosure is illustrated in more detail with reference to the following examples, which are for illustrative purposes and should not be construed as limiting the scope of the present disclosure. Any percentages listed are by weight (wt %) unless otherwise specified. Controlled stirring during testing was done with a 1 inch stirring bar at 300 rpm unless otherwise noted.

General Procedure 1

Formulation Blending

Sample etching compositions were prepared using commercially available reagent grade or electronics grade high purity ingredients. All test samples were prepared at 200 gram test size individually in 250 mL HDPE bottles using the same ingredients with the same order of addition. To the 250 mL bottle, each sample was prepared by addition by weight of 1) ethylene glycol butyl ether co-solvent, 2) 5-MBTA corrosion inhibitor, 3) 95% of total required ultrapure deionized water, 4) hydrogen peroxide (31%), and 5) DTPA. The sample was stirred using a 1" stir bar at 325 rpm in the 250 mL HDPE bottle to achieve full solubility of all components at 20° C. Once fully blended, the sample was transferred from the 250 mL HDPE bottle to a 600 mL glass beaker, placed on a hot plate, and heated to the target temperature (65° C.). During this heating period and pH adjustment stage, the 600 mL glass beaker was sealed to prevent evaporative loss using a flexible Parafilm® cover. The 600 mL glass beaker containing approximately 190 grams of sample solution was stirred continuously while heating using a 1" stir bar at 400 rpm. A pre-calibrated, standard epoxy body pH probe was then placed into the sample solution while stirring, and pH response of the probe was allowed to equilibrate to temperature. At that point, the base pH-adjustor was incrementally added by volumetric pipette while the pH was monitored until the target pH was reached at 65° C. Once the target pH was reached, the final addition of remaining DI water was used to bring the final test sample weight to exactly 200 g. The weight of added DI water and base adjustor were calculated and the total amounts of all components were recorded in the data record in weight percent. The temperature was measured during the tests using pre-calibrated Teflon coated glass thermometers to insure the temperature was within ±1 degree Celsius of the target during testing and pH adjustments at temperature. Later test sample blends would be made in the same addition order at room temperature as needed once the precise amounts of pH adjusting base were known from the 65° C. pH adjustment evaluations and were done in 200 g or 400 g batch sizes.

General Procedure 2

Materials and Methods

Blanket film etch rate measurements on films were carried out using commercially available unpatterned 300 mm diameter wafers that were diced into 0.5"×0.5" test coupons for evaluation. Primary blanket film materials used for testing include 1) unalloyed cobalt metal film of about 200 Å thickness deposited on a silicon substrate, 2) unalloyed copper metal film of about 800 Å thickness deposited on a silicon substrate, 3) titanium nitride film of about 200 Å thickness deposited on 1000 Å $SiO_2$ on a silicon substrate, and 4) blanket silicon nitride film of either 700 or 1350 Å thickness deposited on a silicon substrate. Additional blanket materials evaluated include ILD 1 and ILD 2 [proprietary interlayer low k dielectrics] of 1000 or 2500 Å thickness on $SiO_2$ on a silicon substrate.

The blanket film test coupons were measured for pre-treatment and post-treatment thickness to determine blanket film etch rates. For the cobalt and copper metal blanket films, the film thickness was measured by sheet resistance using a CDE Resmap 273 4-point probe. For the SiN, TiN, and ILD (dielectric films), the film thicknesses were measured pre-treatment and post-treatment by Ellipsometry using a Woollam M-2000X.

Patterned test coupons were evaluated for etching and materials compatibility in the test solutions prepared by General Procedure 1 according to the procedures described in General Procedure 3.

Two types of patterned wafers were evaluated for materials compatibility and/or etching response. For materials compatibility, a chemical mechanically polished 300 mm wafer consisting of patterned cobalt metal inlayed into an ILD (dielectric pattern) was used to evaluate cobalt and ILD compatibility for the test formulations. The post-treatment test coupons were then subjected to evaluation by scanning electron microscopy (SEM). The SEM images from the post treatment coupon were compared to a previously taken pre-treatment SEM image set to evaluate materials compatibility and etching response of each test formulation with the patterned test device features.

General Procedure 3

Etching Evaluation with Beaker Test

All blanket film etch rate and patterned coupon etch testing was carried out in a 65° C. heated 600 mL glass beaker containing 200 g of a sample solution with continuous stirring at 250 rpm, with the Parafilm® cover in place at all times to minimize evaporative losses. All blanket or patterned test coupons having either a pattern or a blanket metal or dielectric film exposed on one side to the sample solution were diced by diamond scribe into 0.5"×0.5" square test coupon size for beaker scale testing. Each individual test coupon was held into position using a single 4" long, locking plastic tweezers clip. The test coupon, held on one edge by the locking tweezers clip, was suspended into the 600 mL glass beaker and immersed into the 200 g test solution while the solution was heated at 65° C. and stirred continuously at 250 rpm. Immediately after each sample coupon was placed into the heated and stirred solution, the top of the 600 mL glass beaker was covered and resealed with Parafilm®. The test coupons were held static in the stirred, heated solution until the treatment time (as described in General Procedures 3A and 3B) had elapsed. After the treatment time in the test solution had elapsed, the sample coupons were immediately removed from the 600 mL glass beaker and rinsed according to General Procedure 3A (blanket test coupons) or General Procedure 3B (patterned coupons). After the final DI rinse step, all test coupons were subject to a filtered nitrogen gas blow off step using a hand held nitrogen gas blower which forcefully removed all traces of DI water to produce a final dry sample for test measurements.

General Procedure 3A (Blanket Test Coupons)

Immediately after a treatment time of 10 minutes according to General Procedure 3, the coupon was immersed in a 1000 mL volume of ultra-high purity deionized (DI) water with ~1 liter/min overflow rate at 20° C. for 30 seconds and then for an additional 30 seconds with mild agitation. The processing was completed according to General Procedure 3.

General Procedure 3B (Patterned Test Coupons)

Immediately after a treatment time of 3 or 20 minutes (depending on the experiment) the patterned test coupon was immersed in a 1000 mL volume of ultra-high purity deionized water with ~1 liter/min overflow rate at 20° C. for 30 seconds with mild agitation to affect an initial DI water rinse step. The patterned test coupons were removed from the DI water rinse and immediately placed into a 1000 ml volume of dilute $NH_4OH$ (~0.3 wt %) for 30 seconds with mild agitation, followed by a final 30 second rinse in the 1000 mL DI water overflow rinse. The processing was completed according to General Procedure 3.

Examples 1 and 2

The formulations in Table 1 were used to etch TiN according to General Procedures 3 and 3A.

In order for the compositions to be appropriate for use in the manufacturing process, several conditions need to be simultaneously met. These conditions are a) having a TiN etch rate >100 Å/minute; b) having a Co etch rate of <1 Å/minute; c) maintaining compatibility with other materials exposed to the etchant when etching TiN, and d) having shelf life stability in order to maintain a), b), and c) over time. It is preferred that the etch time be 3 minutes or less in manufacturing. Table 1 summarizes the ingredients and their amounts used in Formulation Examples 1 and 2 (i.e., FE-1 and FE-2). The results of etching experiments employing Formulation Examples 1 and 2 with various materials are reported in Table 2.

TABLE 1

| FORM. EX. # | WATER SOLUBLE ORGANIC SOLVENT | TRIAZOLE | POLYAMINO-POLY-CARBOXYLIC ACID | AMIDINE | 31.1% $H_2O_2$ | $H_2O$ ADDED |
|---|---|---|---|---|---|---|
| FE-1 | EGBE (40.00 g) | 5MBTA (0.88 g) | DTPA (1.00 g) | DBU (2.66 g) | 153.34 g | 201.12 g |
| FE-2 | EGBE (40.00 g) | 5MBTA (0.88 g) | DTPA (1.00 g) | DBN (2.05 g) | 153.34 g | 201.73 g |

EGBE = ethylene glycol monobutyl ether;
5MBTA = 5-methyl benzotriazole
DTPA = diethylenetriaminepentaacetic acid;
DBU = 1,8-diazabicyclo[5.4.0]undec-7-ene;
DBN = 1,5-diazabicyclo[4.3.0]non-5-ene

TABLE 2

| EX. # | 1 | 2 |
|---|---|---|
| Form. Ex. # | FE-1 | FE-2 |
| TiN etch rate* | 206 ± 3.2 | 301 ± 32.3 |
| Cobalt etch rate* | 0.16 | 0.16 |
| SiN etch rate* | 0.31 ± 0.30 | 0.44 ± 0.06 |
| ILD 1 | 0.0 | 0.40 ± 0.24 |
| ILD 2 | 0.30 ± 0.42 | 1.27 ± 0.60 |
| Cu etch rate* | 1.45 | 1.45 |
| pH | 8.12 | 8.11 |
| pH (aged**) | 7.35 | 7.51 |

*angstroms/minute
**aged 18 hours at 60° C.

The results in Table 2 show that the etching compositions of this disclosure have high TiN etch rates, low Co etch rates, and maintain compatibility with SiN, ILD1, ILD2, and Cu films. When the etchant is aged at 60° C. for 18 hours, there is a drop in pH, although the etching results were similar.

Examples 3-4 and Comparative Examples CE-1-CE-4

The compositions in Table 3 were used to study the effect of pH on the TiN, Co, SiN, and Cu etch rates. The compositions were essentially the same except for the amount of DBU added to adjust the pH, with the corresponding amount of water removed. The etching was carried out according to General Procedures 3 and 3A. The results are shown in Table 4.

TABLE 3

| FORM. EX. # | WATER SOLUBLE ORGANIC SOLVENT | TRI-AZOLE | POLYAMINO-POLY-CARBOXYLIC ACID | AMIDINE | 31.1% $H_2O_2$ | $H_2O$ ADDED | pH |
|---|---|---|---|---|---|---|---|
| CFE-1 | EGBE (40.00 g) | 5MBTA (0.88 g) | DTPA (1.00 g) | DBU (1.75 g) | 153.34 g | 202.3 g | 4.00 |
| CFE-2 | EGBE (40.00 g) | 5MBTA (0.88 g) | DTPA (1.00 g) | DBU (2.15 g) | 153.34 g | 201.63 g | 5.00 |
| CFE-3 | EGBE (40.00 g) | 5MBTA (0.88 g) | DTPA (1.00 g) | DBU (2.24 g) | 153.34 g | 201.54 g | 5.50 |
| CFE-4 | EGBE (40.00 g) | 5MBTA (0.88 g) | DTPA (1.00 g) | DBU (2.28 g) | 153.34 g | 201.5 g | 6.00 |
| FE-3 | EGBE (40.00 g) | 5MBTA (0.88 g) | DTPA (1.00 g) | DBU (2.30 g) | 153.34 g | 201.48 g | 6.50 |
| FE-4 | EGBE (40.00 g) | 5MBTA (0.88 g) | DTPA (1.00 g) | DBU (2.66 g) | 153.34 g | 201.12 g | 8.2-8.3 |

EGBE = ethylene glycol monobutyl ether
5MBTA = 5-methyl benzotriazole
DTPA = diethylenetriaminepentaacetic acid
DBU = 1,8-diazabicyclo[5.4.0]undec-7-ene

TABLE 4

| Ex. # | FORM. EX.# | TiN etch rate* | Cobalt etch rate* | SiN etch rate* | Cu etch rate* | pH |
|---|---|---|---|---|---|---|
| CE-1 | CFE-1 | 57.1 ± 5.29 | 28.73 | 0 | 27.8 | 4 |
| CE-2 | CFE-2 | 40.9 ± 0.3 | 29.47 | 0 | 1.86 | 5 |
| CE-3 | CFE-3 | 53.3 ± 0.2 | 7.57 | 0.37 | 1.39 | 5.5 |
| CE-4 | CFE-4 | 86.4 ± 3.3 | 1.01 | not measured | 1.49 | 6 |
| 3 | FE-3 | 107.8 ± 2.9 | 0.22 | not measured | 1.35 | 6.5 |
| 4 | FE-4 | 206 ± 9 | 0.3 | 0.6 | 1.4 | 8.2-8.3 |

*angstroms/minute

The data in Table 4 shows that the pH plays an important role in the etching of the TiN and Co Films. As the pH drops, the TiN etch rate drops, and the Co etch rate increases. Only at a pH of above about 6.5 are the criteria a) and b) above simultaneously met. Considering the pH drop noted with aging, and the increase in TiN etch rate with increasing pH. In some embodiments, the pH is at least above about 7. In some embodiments, the pH is at least above about 7.5. In some embodiments, the pH is at least above about 8.

Examples 5-6 and Comparative Examples CE-5 to CE-9

The formulations in Table 5 containing either an amidine or an amine compound as a comparative were employed to conduct an aging study. TiN and Co films were etched according to General Procedures 3 and 3A with the compositions after aging at 60° C. for 120 hours. The results are shown in Table 6.

TABLE 5

| FORM. EX. # | WATER SOLUBLE ORGANIC SOLVENT | TRIAZOLE | POLYAMINO-POLY-CARBOXYLIC ACID | BASE | 30.0% $H_2O_2$ | $H_2O$ ADDED |
|---|---|---|---|---|---|---|
| FE-5 | EGBE (20.00 g) | 5MBTA (0.44 g) | DTPA (0.50 g) | DBU (1.04 g) | 33.67 g | 131.35 g |
| CFE-5 | EGBE (20.00 g) | 5MBTA (0.44 g) | DTPA (0.50 g) | ethanolamine (0.44 g) | 33.67 g | 131.95 g |
| CFE-6 | EGBE (20.00 g) | 5MBTA (0.44 g) | DTPA (0.50 g) | diethylamine (0.65 g) | 33.67 g | 131.74 g |
| CFE-7 | EGBE (20.00 g) | 5MBTA (0.44 g) | DTPA (0.50 g) | triethylamine (0.72 g) | 33.67 g | 131.67 g |
| FE-6 | EGBE (20.00 g) | 5MBTA (0.44 g) | DTPA (0.50 g) | DBN (0.84 g) | 33.67 g | 131.55 g |
| CFE-8 | EGBE (20.00 g) | 5MBTA (0.44 g) | DTPA (0.50 g) | diethanolamine (1.26 g) | 33.67 g | 131.13 g |
| CFE-9 | EGBE (20.00 g) | 5MBTA (0.44 g) | DTPA (0.50 g) | triethanolamine (3.00 g) | 33.67 g | 129.39 g |

DBU = .1,8-diazabicyclo[5.4.0]undec-7-ene
5MBTA = 5-methyl benzotriazole
DBN = 1,5-diazabicyclo[4.3.0]non-5-ene
EGBE = ethylene glycol monobutylether
DTPA = diethylenetriaminepentaacetic acid

TABLE 6

| EX. # | FORM. EX. # | TiN etch rate* | Cobalt etch rate* | pH | pH (aged) |
|---|---|---|---|---|---|
| 5 | FE-5 | 124.7 | 0.10 | 8.19 | 5.82 |
| CE-5 | CFE-5 | 44.0 | >20 | 8.13 | 4.55 |
| CE-6 | CFE-6 | 21.1 | >20 | 8.16 | 4.50 |
| CE-7 | CFE-7 | not measured | >20 | 8.10 | 5.38 |
| 6 | FE-6 | 100.45 | 0.07 | 8.17 | 6.29 |
| CE-8 | CFE-8 | not measured | >20 | 8.14 | 4.25 |
| CE-9 | CFE-9 | not measured | >20 | 8.12 | 5.03 |

*angstroms/minute after aging at 60° C. for 120 hours

The data shows that conventional amines employed in the compositions to control pH do not have the shelf life stability that the amidine bases in the compositions of this disclosure do. The pH of Comparative Formulations CFE-5, 6, 7, 8, and 9 dropped from over 8 to less than pH 5.4, whereas Formulations FE-5 and FE-6 maintained a pH>5.8. Furthermore, Formulations FE-5 and FE-6 still yielded a TiN etch rate >100 Å/minute and a Co etch rate of <1 Å/minute, while the comparative examples had a Co etch rate of >20 Å/minute and a TiN etch rate of <100 Å/minute.

Examples 7 and 8

Patterned wafers (as described in General Procedure 2) were etched for 3 minutes according to General Procedures 3 and 3B using Formulation Examples FE-3 (Example 7) and FE-4 (Example 8). Clean etching and materials compatibility was confirmed by SEM imaging. SEM images demonstrate a high titanium nitride etch rate with compatibility to copper, cobalt, silicon nitride and low-k ILD films.

Etch rates of copper, cobalt, silicon nitride and low-k ILD films were consistent with the blanket film etch rates.

Examples 9 and 10

The compositions in Table 7 were used to study the effect of hydrogen peroxide content on the TiN, Co, SiN, and ILD, Cu etch rates. The compositions were essentially the same except for the amount of hydrogen peroxide added, with the corresponding amount of water removed. The etching was carried out according to General Procedures 3 and 3A. The results are shown in Table 8.

TABLE 7

| FORM. EX. # | WATER SOLUBLE ORGANIC SOLVENT | TRIAZOLE | POLYAMINO-POLY-CARBOXYLIC ACID | AMIDINE | 30.0% $H_2O_2$ | $H_2O$ ADDED |
|---|---|---|---|---|---|---|
| FE-7 | EGBE (20.00 g) | 5MBTA (0.44 g) | DTPA (0.50 g) | DBU (1.00 g) | 33.33 g | 144.73 g |
| FE-8 | EGBE (20.00 g) | 5MBTA (0.44 g) | DTPA (0.50 g) | DBU (1.00 g) | 116.67 g | 61.39 g |

TABLE 8

| EX. # | 9 | 10 |
|---|---|---|
| Form. Ex. # | FE-7 | FE-8 |
| TiN etch rate* | 114.0 ± 4.0 | 212.5 ± 1.8 |
| Cobalt etch rate* | 0.2 ± 0.04 | 0.24 ± 0.02 |
| SiN etch rate* | 0.58 ± 0.17 | 0.39 ± 0.07 |
| ILD 1 | 0.24 ± 0.07 | 0.58 ± 0.08 |
| ILD 2 | 0.53 ± 0.25 | 0 |
| Cu etch rate* | 0.8 ± 0.54 | 1.90 ± 0.06 |
| pH | 7.85 | 7.4-7.5 |

Although some of the increase in etch rate may be due to a difference in pH, it is clear that an increase in the hydrogen peroxide content increased the TiN etch rate with only small effects on the etch rate of other materials except Cu.

Formulation Examples Fe-9 to Fe-18

The compositions of the disclosure are further exemplified by Formulation Examples FE-9 to FE18 as shown in Table 9 below.

TABLE 9

| FORM. EX. # | WATER SOLUBLE ORGANIC SOLVENT | TRIAZOLE | POLYAMINO-POLY-CARBOXYLIC ACID | AMIDINE | OXIDIZER | H$_2$O |
|---|---|---|---|---|---|---|
| FE-9 | PGME (20 g) | BTA (0.2 g) | EDTA (0.818 g) | formamidine (0.236 g) | ammonium persulfate (20 g) | 58.746 g |
| FE-10 | TGA (15 g) | 5-amino-triazole (0.5 g) | CDTA (0.1 g) | acetamadine (0.1 g) | peracetic acid (15 g) | 69.3 g |
| FE-11 | diethylene glycol (15 g) | 4-n-butylbenzotriazole (0.3 g) | DAPTA (0.2 g) | methyl acetamidine (0.4 g) | ammonium perchlorate (25 g) | 59.1 g |
| FE-12 | 2,3-butanediol (30 g) | benzotriazole-5-carboxylic acid (0.7 g) | PDTA (0.3 g) | ethyl acetamidine (0.3 g) | ammonium periodate (15 g) | 53.7 g |
| FE-13 | Ethylene glycol monobenzyl ether (25 g) | naphthotriazole (0.1 g) | EDDA (0.5 g) | diminazen (0.7 g) | Methane persulfonic acid (30 g) | 43.7 g |
| FE-14 | cyclohexanone (10 g) | 5-phenyl-benzotriazole (0.8 g) | TTHA (0.60 g) | benzamidine (0.535 g) | urea/hydrogen peroxide (10 g) | 78.065 g |
| FE-15 | Propargyl alcohol (20 g) | 5-hydroxybenzotriazole (0.4 g) | EDTA (0.75 g) | formamidine (0.6 g) | p-toluene persulfonic acid (15 g) | 63.25 g |
| FE-16 | 2-butenyl alcohol (10 g) | 3-amino-5-mercapto-1,2,4-triazole (0.05 g) | CDTA (0.1 g) | acetamadine (0.1 g) | Perphosphoric acid (20 g) | 69.75 g |
| FE-17 | methanol (20 g) | BTA (0.4 g) | DAPTA (0.25 g) | diminazen (0.4 g) | Tetramethyl-ammonium perchlorate (10 g) | 68.95 g |
| FE-18 | Pinacol (22 g) | 5-nitrobenzotriazole (0.075 g) | EDDA (0.65 g) | methyl acetamidine | di-tert-butyl peroxide (15 g) | 62.075 |

PGME = propylene glycol monomethyl ether
CDTA = trans-1,2-diaminocyclohexane tetraacetic acid
TTHA = triethylenetetraminehexaacetic acid
BTA = benzotriazole
DAPTA = diaminopropanol tetraacetic acid
PDTA = propylenediaminetetraacetic acid
EDDA = ethylenediamine dipropionic acid

What is claimed is:

1. An etching composition, comprising:
   1) at least one oxidizing agent comprising hydrogen peroxide, the at least one oxidizing agent being in an amount of from about 5% to about 20% by weight of the composition;
   2) at least one chelating agent comprising diethylenetri-aminepentaacetic acid, the at least one chelating agent being in an amount of from about 0.1% to about 1% by weight of the composition;
   3) at least one metal corrosion inhibitor comprising substituted or unsubstituted benzotriazole, the at least one metal corrosion inhibitor being in an amount of from about 0.1% to about 1% by weight of the composition;
   4) at least one organic solvent;
   5) at least one amidine base comprising an amidine group in a fused non-aromatic ring, the at least one amidine base being in an amount of from about 0.3% to about 2% by weight of the composition; and
   6) water;
   wherein the composition has a pH of at least about 6.5 and at most about 9.5, and the composition does not contain an abrasive.

2. The composition of claim 1, wherein the composition has a pH higher than 7 and at most about 9.

3. The composition of claim 1, wherein the at least one oxidizing agent is from about 5% to about 15% by weight of the composition.

4. The composition of claim 1, wherein the at least one metal corrosion inhibitor comprises a benzotriazole optionally substituted by at least one substituent selected from the group consisting of alkyl groups, aryl groups, halogen groups, amino groups, nitro groups, alkoxy groups, and hydroxyl groups.

5. The composition of claim 4, wherein the substituted or unsubstituted benzotriazole is selected from the group consisting of benzotriazole, 5-aminobenzotriazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 2-(5-amino-pentyl)-benzotriazole, 1-amino-benzotriazole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butyl benzotriazole, 5-(1',1'-dimethylpropyl)-benzotriazole, 5-(1',1',3'-trimethylbutyl)benzotriazole, 5-n-octyl benzotriazole, and 5-(1',1',3',3'-tetramethylbutyl)benzotriazole.

6. The composition of claim 1, wherein the at least one metal corrosion inhibitor is from about 0.1% to about 0.7% by weight of the composition.

7. The composition of claim 1, wherein the at least one organic solvent comprises a solvent selected from the group consisting of water soluble alcohols, water soluble ketones, water soluble esters, and water soluble ethers.

8. The composition of claim 1, wherein the at least one organic solvent is from about 1% to about 30% by weight of the composition.

9. The composition of claim 1, wherein the amidine base containing an amidine group in a fused non-aromatic ring is 1,8-diazabicyclo[5.4.0]undec-7-ene or 1,5-diazabicyclo[4.3.0]non-5-ene.

10. The composition of claim 1, wherein the at least one amidine base is from about 0.3% to about 1% by weight of the composition.

11. The composition of claim 1, wherein the water is from about 35% to about 85% by weight of the composition.

12. The composition of claim 1, wherein the at least one chelating agent is from about 0.1% to about 0.7% by weight of the composition.

13. A method, comprising:
    contacting a semiconductor substrate containing TiN features with a composition of claim 1 to remove the TiN features.

14. The method of claim 13, wherein the method does not substantially remove Co, SiN, or Cu in the semiconductor substrate.

15. The method of claim 13, further comprising rinsing the semiconductor substrate with a rinse solvent after the contacting step.

16. The method of claim 15, further comprising drying the semiconductor substrate after the rinsing step.

\* \* \* \* \*